United States Patent [19]
McEwan

[11] Patent Number: 5,274,271
[45] Date of Patent: Dec. 28, 1993

[54] ULTRA-SHORT PULSE GENERATOR

[75] Inventor: Thomas E. McEwan, Livermore, Calif.

[73] Assignee: Regents of the University of California, Oakland, Calif.

[21] Appl. No.: 729,276

[22] Filed: Jul. 12, 1991

[51] Int. Cl.$^5$ .......................... H03K 3/00; H03K 5/01
[52] U.S. Cl. .................... 307/108; 307/268; 333/20
[58] Field of Search ................ 307/106–108, 307/314, 266, 268; 328/65–67; 333/20

[56] References Cited
U.S. PATENT DOCUMENTS

| | | | |
|---|---|---|---|
| 3,626,200 | 12/1971 | Sasayama | 307/106 |
| 3,673,423 | 6/1972 | Planas | 307/107 |
| 3,878,449 | 4/1975 | Wilhelmi et al. | 307/108 |
| 3,983,416 | 9/1976 | Cronson | 307/260 |
| 4,274,134 | 6/1981 | Johannessen | 363/59 |
| 4,442,362 | 4/1984 | Rao | 307/108 |
| 4,855,696 | 8/1989 | Tan et al. | 333/20 |
| 4,956,568 | 9/1990 | Su et al. | 307/352 |
| 5,014,018 | 5/1991 | Rodwell et al. | 333/20 |
| 5,023,574 | 6/1991 | Anklam et al. | 333/20 |

Primary Examiner—A. D. Pellinen
Assistant Examiner—Richard T. Elms
Attorney, Agent, or Firm—Henry P. Sartorio; W. Douglas English

[57] ABSTRACT

An inexpensive pulse generating circuit is disclosed that generates ultra-short, 200 picosecond, and high voltage 100 kW, pulses suitable for wideband radar and other wideband applications. The circuit implements a nonlinear transmission line with series inductors and variable capacitors coupled to ground made from reverse biased diodes to sharpen and increase the amplitude of a high-voltage power MOSFET driver input pulse until it causes non-destructive transit time breakdown in a final avalanche shockwave diode, which increases and sharpens the pulse even more.

11 Claims, 2 Drawing Sheets

ULTRA-SHORT PULSE GENERATOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

This invention relates to pulse generating circuits. More particularly, this invention relates to circuits that can repeatedly generate powerful, high voltage pulses of extremely short duration. These types of circuits are critical to the development of ultra-high resolution radar and new spread spectrum communication modes, as well as many other applications requiring broadband radiation.

Much recent research has focused on laser-diode driven GaAs optical switches, but these devices have yet to switch reliably in less than 200 picoseconds, and their associated laser-diodes have repetition rate and reliability problems. Other methods of generating fast, low jitter transients include GaAs thyristors and magnetic shock lines, but GaAs thyristors are not commercially available, and magnetic shock lines require extremely high power levels.

Two existing diode related technoloties form the basis for the present invention:

Nonlinear transmission lines that utilize the nonlinear capacitance of reverse biased semiconductor diodes have been described in the literature, however they are operated at low voltages, usually around 10 volts. Their output pulses are not powerful enough for use in the radar and communication applications mentioned above.

Pulse generators exploiting a non-destructive "transit time" avalanche breakdown mechanism in ordinary diodes have also been developed. (This is an extremely rapid avalanche breakdown of the TRAPATT variety.) In 1979 the Soviets discovered that this mechanism could be used with diodes to make leading edge "pulse sharpeners" by causing the diodes to break down in a pulsed bias mode instead of using a continuous reverse bias as in the TRAPATT mode. The problem with these pulse generators is the avalanche mechanism has a drive requirement of 2-3 kV per nanosecond. Such a high drive requirement is generally supplied by UHF vacuum planar triodes, which are both expensive and impractical for many applications. Also, they need to be replaced periodically.

The widespread need for an inexpensive and practical pulse generator is filled by combining the above technologies in a truly unique way to make a device according to the present invention.

SUMMARY OF THE INVENTION

It is an object of the present invention to provide a pulse generator that generates 100 kW pulses with widths of 200 picoseconds, or less, while operating from a 1 watt DC power supply.

It is a further object of the invention to provide a pulse generator that can be built from readily available components costing far less than any comparable device.

These, and other objects of the invention are realized by using a driver circuit to pulse an appropriately designed nonlinear transmission line at a much higher voltage than has been done in the past. Preferably, the driver is a power MOSFET circuit. Suitable driver circuits are commercially available. The driver furnishes a high-voltage, step-like input pulse that increases in voltage, and decreases in duration as it passes through the transmission line. This happens because the transmission line of the present invention is unique in that it utilizes reverse biased pn diodes to form nonlinear capacitors.

The transmission line comprises a series of stages with each stage having an inductor and one or more diode-capacitors. The inductors of successive stages are connected in series, and the diode-capacitors are connected between the inductor outputs (in their respective stages) and ground. The stages may be advantageously tapered in LC product for more rapid pulse compression. Each stage sharpens and raises the voltage peak of the step-like input from the driver circuit. The length of the nonlinear transmission line is chosen so that the voltage step at the final stage induces transit time avalanche breakdown in a diode that is placed in a suitable breakdown circuit at the output of the nonlinear transmission line. This advantageously sharpens the output pulse of the circuit even more, making it short enough for use in many broadband applications. (Two breakdown circuits are disclosed-shunt and series. The former is unique to the present invention, and is similar to the stages in the transmission line. The latter has been used in the past, but a nonlinear transmission line was not used as the driver circuit.)

It is a novel feature of the present invention to utilize a commercially available circuit to drive a nonlinear transmission line, and generate a pulse capable of inducing transit time avalanche breakdown in an ordinary diode. Since this type of breakdown is non-destructive, the pulse repetition rate is limited mainly by the speed of the driver circuit.

DETAILED DESCRIPTION OF THE INVENTION

Figure 1A:
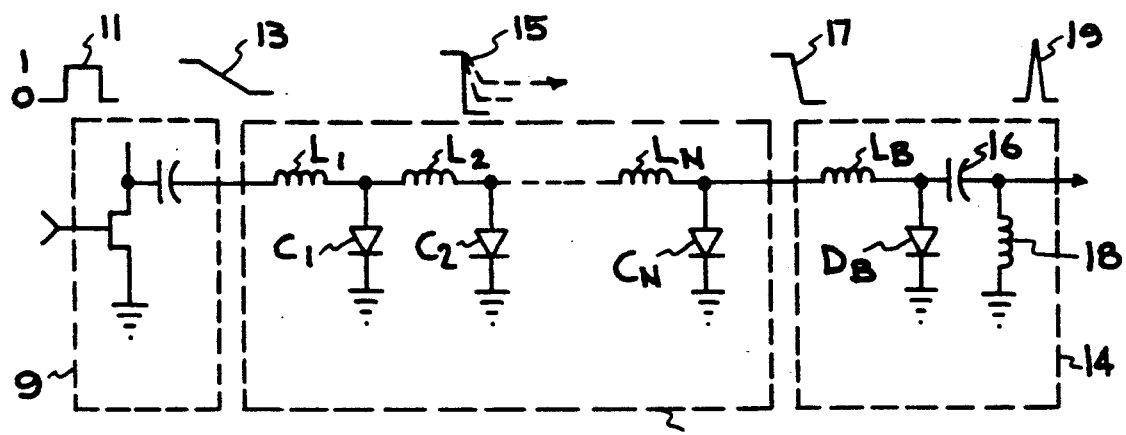
FIG. 1a illustrates a schematic of the three major components of the pulse generator invention, including a power MOSFET driver, a nonlinear transmission line, and an avalanche shockwave diode.

In a preferred embodiment of the present invention the ultra short pulse generator circuit consists of a power MOSFET driver circuit 9 with an ECL input, trigger pulse 11, a nonlinear transmission line 12 and an avalanche shockwave diode breakdown circuit 14, with a video/baseband output 19 connected in series as illustrated in FIG. 1a. Nonlinear transmission line 12 is arranged in stages, with each stage including an inductor, and a variable capacitor based on the variable capacitance of ordinary reverse biased pn junctions. Each capacitor is formed from ordinary reverse biased diodes. As shown in FIG. 1a, transmission line 12 has N stages ranging from $L_1, C_1$ to $L_N, C_N$. Breakdown circuit 14 includes one last inductor $L_B$, diode $D_B$, capacitor 16, and optional inductor 18.

An ECL trigger pulse 11 into power MOSFET driver circuit 9 is a single positive TTL or ECL logic level pulse in the realm of 1 to 3 volts. The input pulse 13 from the driver circuit 9 into transmission line 12 is a negative, step-like pulse in the realm of 900 volts. Transmission line 12 sharpens the input voltage step while increasing its amplitude indicated as pulse 15 until it will induce transit time avalanche breakdown drive pulse 17 in the realm of 2400 volts in diode $D_B$ in circuit 14; gain in nonlinear transmission line 12 is approximately 1200 volts from crossing a 50 ohm impedance which doubled to 2400 volts due to open circuit reflection. Normally a transmission line would not have this property—this unexpected result is due to the capacitance variation of pn junctions when reverse biased. When diode $D_B$ sees approximately 4500 volts due to resonance boost and parametric gain, it breaks down and the voltage step is sharpened still further. Inductor $L_B$ prevents the breakdown output from traveling back towards transmission line 12.

Figure 1B:
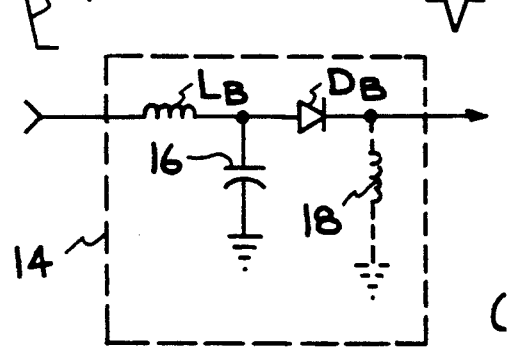
FIG. 1b shows a prior art breakdown circuit in a series configuration which may be used with the nonlinear transmission line to form another preferred embodiment of the present invention.

Capacitor 16 then changes the sharpened step-like pulse into an output pulse shaped as shown in either FIGS. 1a or 1b, depending on which circuit 14 is used for the output. The output pulse 18 of circuit 14 will be the derivative of the charge on capacitor 16 and is a sharp positive pulse in the realm of 1500 volts if circuit 14 has diode $D_B$ connected as a shunt, as in FIG. 1a. It will be a sharp negative pulse 21 if circuit 14 is connected as in FIG. 1b, with capacitor 16 and breakdown diode $D_B$ interchanged so diode $D_B$ is connected in series. (The prior art series connection shown in FIG. 1b was previously driven with relatively expensive and unreliable vacuum planar triodes.) It will be understood by one knowledgeable in the art that pulse diagrams in FIGS. 1a and 1b are for purposes of visual clarification and illustration only and are not drawn in relation to size.

Optional inductor 18 reduces a small precurser that appears because of the capacitive coupling of the drive to the circuit output through capacitor 16. The precurser is slightly smaller for the shunt configuration shown in FIG. 1a because the capacitance of capacitor 16 is set smaller than the junction capacitance of diode $D_B$.

A preferred embodiment of the pulse generator uses a power MOSFET driver 9 or other commercially available driver, with a nine stage (N=9) transmission line 12 to induce transit time avalanche breakdown in diode $D_B$ of circuit 14.

Two HV1000 pulsers, made by Directed Energy, Inc. of Colorado are connected in parallel to form the driver circuit. They deliver a −1 kV steplike pulse with a 6 ns risetime to the input of circuit 12. Circuit 12 uses standard #1N5408 diodes for this embodiment. The inductances, and the number of diodes needed to form the capacitors in circuit 12 are listed in Table I.

TABLE 1

| | Inductances | No. of diodes in parallel |
|---|---|---|
| $L_1, C_1$ | 37 nH | 15 |
| $L_2, C_2$ | 31 nH | 13 |
| $L_3, C_3$ | 26 nH | 11 |
| $L_4, C_4$ | 22 nH | 9 |
| $L_5, C_5$ | 18 nH | 7 |
| $L_6, C_6$ | 15 nH | 5 |

TABLE 1-continued

| | Inductances | No. of diodes in parallel |
|---|---|---|
| $L_7, C_7$ | 13 nH | 4 |
| $L_8, C_8$ | 11 nH | 3 |
| $L_9, C_9$ | 9 nH | 2 |

The above components form transmission line 12. In this embodiment transmission line 12 is tapered in LC product by about 20% per stage to reduce the number of stages necessary to achieve an output that will induce transit time breakdown in diode $D_B$.

Circuit 14 also uses a single #1N5408 diode for breakdown diode $D_B$. Inductor $L_B$ is a 30 nH inductor. Capacitor 16 is 5 pF, and optional inductor 18 is 15 nH.

A pulse generator with the above components will generate 100 kW, 200 picosecond wide pulses.

The present inventor has also built a current-mirror driver circuit (not disclosed in this application) that uses MOSFETs to generate −1 kV, 2 ns voltage steps to drive transmission line 12 with a 1 Watt power supply. With this driver circuit transmission line 12 needs only the last five stages, $L_5, C_5$-$L_9, C_9$, to achieve the same output. (The HV1000 pulsers driving $L_1, C_1$-$L_4, C_4$ generate an equivalent pulse.) It is this circuit which is used to drive a five stage transmission line 12 with the circuit input pulse shown in FIG. 2, and circuit output pulse shown in FIG. 4.

Figure 2:
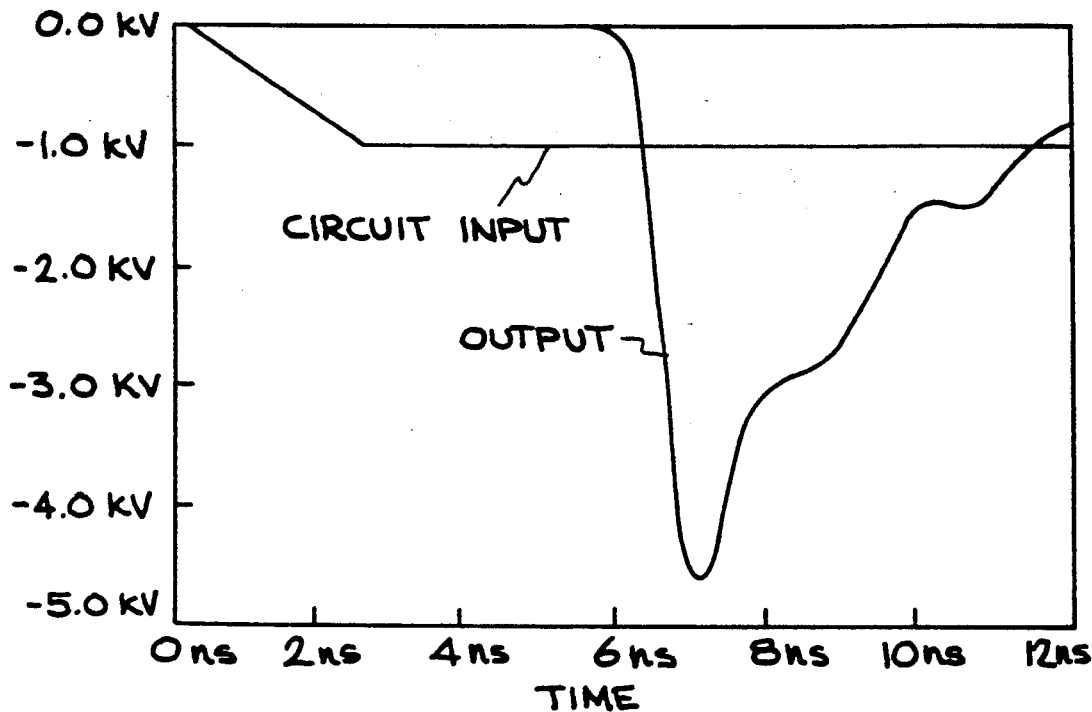
FIG. 2 shows the input and output pulse shapes of a transmission line in accordance with the present invention.

The output pulse shown in FIG. 2 is a graph of the output one gets from circuit 12 without circuit 14, i.e. the graph does not include diode breakdown. One sees a voltage change of about −4.5 kV over 1 ns for the output of circuit 12. The present invention utilizes the variable capacitance of pn junctions to make a five stage LC tapered transmission line which sharpens and increases the amplitude of a pulse by about a factor of nine.

Figure 3:
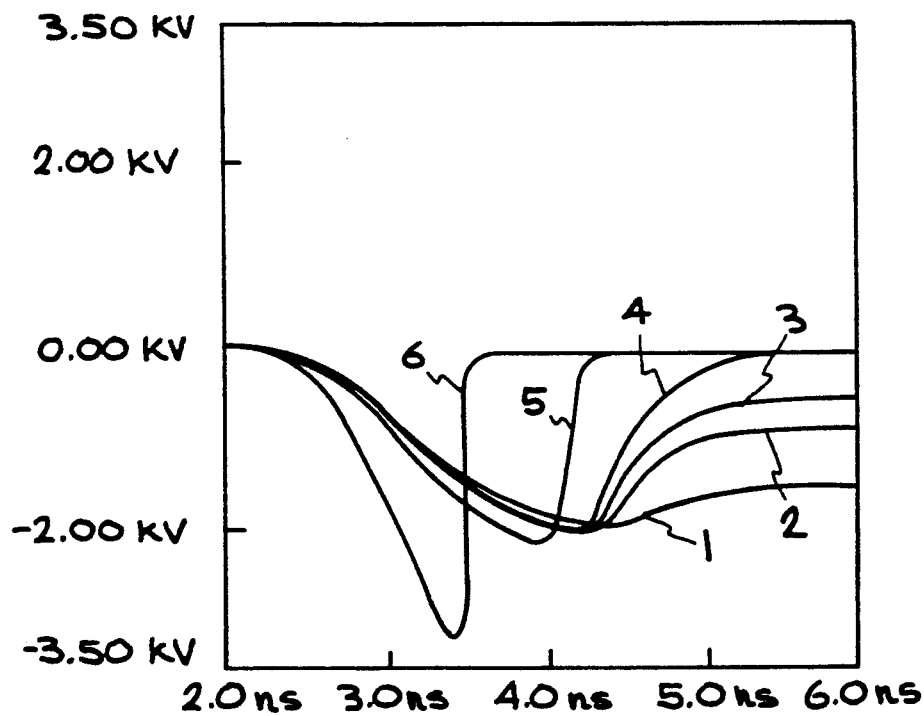
FIG. 3 shows transit time and ordinary avalanche breakdown voltage curves across a pn junction.

The output of circuit 12 has a great enough voltage change over a small enough time period to cause transit time avalanche breakdown of diode $D_B$ in circuit 14. This breakdown mechanism is illustrated in FIG. 3. Curves 1-3 are characteristic of ordinary avalanche breakdown in which the avalanche wave travels slower than the saturation velocity of the current carriers in the diode junction. With this mechanism the avalanche multiplication is localized when it starts, and it begins to slow down as soon as the reverse bias across the pn junction decreases.

Transit time avalanche breakdown occurs when the avalanche wave travels at a velocity greater than the saturation velocity. Typical avalanche velocities are 10-100 times the saturation velocity. This type of breakdown affects the entire pn junction, and it is complete in the sense that it does not stop until the pn junction is no longer reverse biased. A sufficiently large reverse bias over a short enough time causes transit time breakdown, which is characterized by curves 4, 5 and 6 in FIG. 3. Voltage rates of change that are at least twice the static breakdown voltage of the diode per nanosecond will generally cause transit time breakdown.

Figure 4:
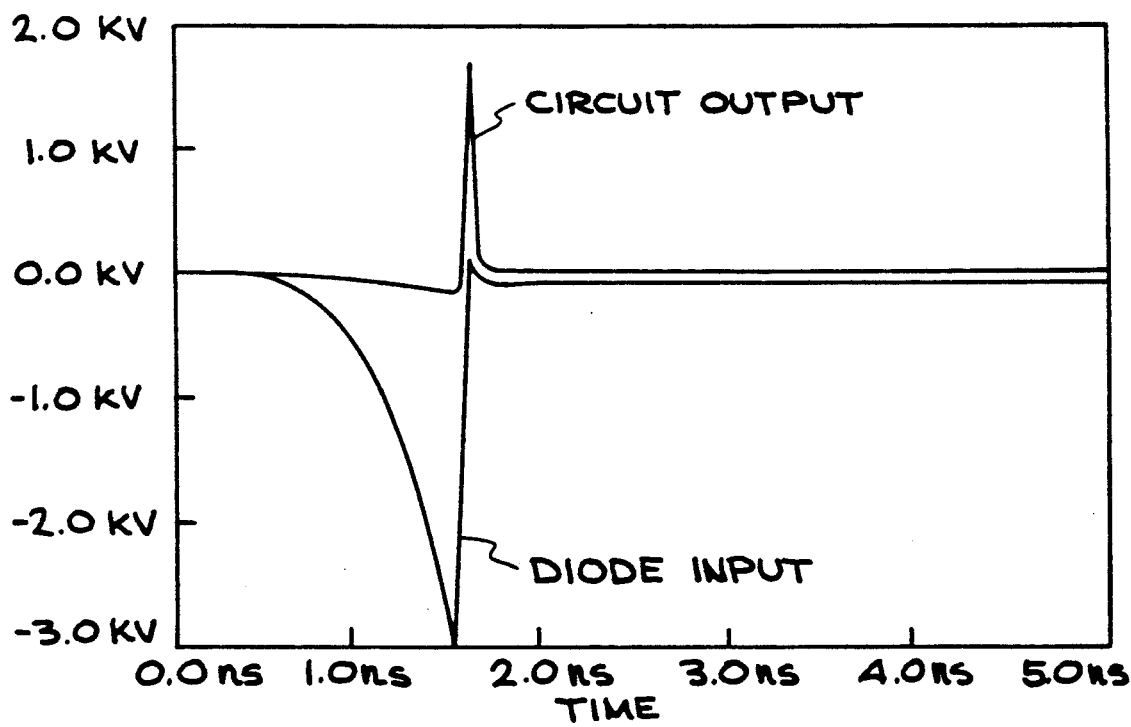
FIG. 4 shows input and output pulse shapes at the breakdown circuit in the shunt configuration.

The input to diode $D_B$, and the resultant output of circuit 14 when diode $D_B$ breaks down is shown in FIG. 4. Diode $D_B$ breaks down at about 3 kV even though it has a static breakdown of 1 kV. This is due to the extremely high drive rate. Ionization rates vary with approximately the sixth power of overvoltage so the breakdown is extremely rapid, and the resulting avalanche wave travels at more than 30 times the saturation velocity.

The output shown in FIG. 4 occurs when circuit 14 is in the shunt configuration, as in FIG. 1a. With a 1.6 kV output across 25 ohms, the pulse generator circuit of FIG. 1a produces a 200 picosecond output pulse with 100 kW of power.

Many variations on the above embodiments are possible. The transmission line need not be tapered in LC product if it is made longer. Instead of using different numbers of diodes connected in parallel to make different sized capacitors one may use different sized diodes. The diodes may be turned around if the input from the driver is a large positive step instead of a large negative step. They may be connected in series to accommodate a higher voltage input without breaking down. Higher power can be realized with parallel connections. Higher speeds, and shorter output pulses can be obtained with GaAs, or other semiconductors. The full scope of the invention is intended to be limited by the following claims.

I claim:

1. A high voltage, ultra short pulse generator, comprising:
   a power MOSFET driver;
   a nonlinear delay line circuit coupled in series with said driver circuit; and
   a shockwave avalanche diode breakdown circuit coupled in series with said delay line.

2. A nonlinear delay line according to claim 1, wherein said delay line circuit comprises a plurality of delay line inductors coupled in series.

3. A nonlinear delay line according to claim 2, wherein each said delay line inductor is coupled to ground through a variable capacitance.

4. A nonlinear delay line according to claim 3, wherein said variable capacitor comprises at least one varactor diode.

5. A nonlinear delay line according to claim 4, wherein each said delay line varactor diode is reverse biased.

6. A nonlinear delay line according to claim 1, wherein said shock wave avalanche diode circuit comprises of an inductor in series with a capacitor and a varactor diode coupled therebetween to ground.

7. A nonlinear delay line according to claim 1, wherein said shockwave avalanche diode circuit comprises an inductor in series with a reverse biased varacter diode and a capacitor therebetween coupled to ground.

8. A method for producing a high voltage, ultra-short baseband pulse, comprising the steps of:
   producing a greater than 100 volt pulse of less than 2 nanosecond duration;
   incrementally increasing the height and concomitantly decreasing the width of said pulse to obtain a shockwave pulse;
   applying said shockwave pulse to a shockwave avalanche diode in a manner to cause diode breakdown and yield said high voltage, ultra-short baseband pulse.

9. A method according to claim 8, wherein the step for increasing the height and decreasing the width utilizes a plurality of inductance elements (L) in series with at least one variable capacitance element (C) and shunting each said inductance to ground, wherein the LC product tapers in each succeeding stage.

10. A method according to claim 9, wherein the L/C ratio is proportional to the characteristic line impedance (Z), and tapers in each succeeding stage.

11. A method according to claim 8 wherein the LC product and the L/C ratio both taper and diminish in each succeeding stage.

* * * * *